(12) United States Patent
Wilner

(10) Patent No.: US 7,276,794 B2
(45) Date of Patent: Oct. 2, 2007

(54) JUNCTION-ISOLATED VIAS

(75) Inventor: Leslie B. Wilner, Palo Alto, CA (US)

(73) Assignee: Endevco Corporation, San Juan Capistrano, CA (US)

( * ) Notice: Subject to any disclaimer, the term of this patent is extended or adjusted under 35 U.S.C. 154(b) by 148 days.

(21) Appl. No.: 11/070,830

(22) Filed: Mar. 2, 2005

(65) Prior Publication Data

US 2006/0199365 A1 Sep. 7, 2006

(51) Int. Cl.
*H01L 23/48* (2006.01)
*H01L 23/52* (2006.01)
*H01L 29/40* (2006.01)

(52) U.S. Cl. ............... 257/742; 257/774; 257/E21.17; 257/E21.042; 257/E21.218; 257/E21.511

(58) Field of Classification Search ................ 257/742, 257/260, 396, 509, 554, 607, 610, 622, 698, 257/774, 775, 929
See application file for complete search history.

(56) References Cited

U.S. PATENT DOCUMENTS

| | | | |
|---|---|---|---|
| 4,257,057 A | | 3/1981 | Cheung et al. |
| 5,034,091 A | | 7/1991 | Trask et al. |
| 5,318,666 A | | 6/1994 | Elkind et al. |
| 5,386,142 A | * | 1/1995 | Kurtz et al. ............. 257/690 |
| 5,468,652 A | * | 11/1995 | Gee ............................. 438/98 |
| 5,904,566 A | | 5/1999 | Tao et al. |
| 5,973,396 A | * | 10/1999 | Farnworth ................. 257/698 |
| 5,996,221 A | | 12/1999 | Chirovsky et al. |
| 6,168,969 B1 | * | 1/2001 | Farnworth ................. 438/106 |
| 6,770,558 B2 | | 8/2004 | Delamarche et al. |
| 2004/0021139 A1 | | 2/2004 | Jackson et al. |
| 2004/0089948 A1 | | 5/2004 | Cheng et al. |
| 2004/0261839 A1 | * | 12/2004 | Gee et al. ................... 136/256 |

OTHER PUBLICATIONS

Andricacos, P. C., et al., "Damascene copper electroplating for chip interconnections," *J. Res. Develop.*, 42(5): 567-574 (1998).

* cited by examiner

*Primary Examiner*—David Nhu
(74) *Attorney, Agent, or Firm*—Paul Davis; Heller Ehrman LLP

(57) ABSTRACT

A process for forming a junction-isolated, electrically conductive via in a silicon substrate and a conductive apparatus to carry electrical signal from one side of a silicon wafer to the other side are provided. The conductive via is junction-isolated from the bulk of the silicon substrate by diffusing the via with a dopant that is different than the material of the silicon substrate. Several of the junction-isolated vias can be formed in a silicon substrate and the silicon wafer coupled to a second silicon substrate of a device that requires electrical connection. This process for forming junction-isolated, conductive vias is simpler than methods of forming metallized vias, especially for electrical devices more tolerant of both resistance and capacitance.

17 Claims, 7 Drawing Sheets

JUNCTION-ISOLATED VIAS

BACKGROUND

Conductive vias carry electrical signals from one side of a semi-conductor wafer to the other, allowing the electrical signals to be transmitted from a power source on one side of the wafer to an electrical device on the other side of the wafer. In a process developed early on to form a p-type via through an n-type silicon substrate, a ball of aluminum is melted through the wafer using a thermal gradient from the entry surface to the exit surface, leaving a highly conductive p-type via in the wafer. However, the processing conditions for the procedure are difficult to control, so such vias have not seen general use.

More recently, practical vias have been made that are particularly useful in integrated circuits. These vias are produced by first forming an opening in a silicon substrate and etching a hole through the opening. Etching the hole using a deep reactive ion etch (DRIE) has allowed the vias to be formed with nearly vertical walls, making them much smaller in dimension and resulting in a greater number of interconnects that are able to be placed in the substrate. The via is then oxidized to isolate it from the wafer and generally filled with metal of some type to provide a conduction path from one surface of the substrate to the other. Traditionally, electrically conductive metals like tungsten or copper have been used to coat the vias. Processes employed to deposit the metal include evaporation or sputtering, chemical vapor deposition (CVD), electroplating and electroless deposition (ELD). In the final step of forming the conductive interconnect, the via is revealed from the back surface of the wafer by etching or polishing away material beyond the depth of the hole.

However, there are problems associated with making vias in the above-described manner. For one, it has been difficult to make vias of a reproducibly accurate dimension. Coating the vias with metal has also been problematic. For example, metal CVD is an expensive process requiring a slow deposition rate at high temperatures. Metal sputtering has restraints similar to CVD and, in addition, presents a difficulty in filling narrow via openings evenly, especially at the via bottom. Hence, the current processes used to make conductive vias are not optimal.

Many electrical devices do not require the low resistance or capacitance offered by metallized vias, making the current method to form conductive interconnects unnecessarily complex. Thus, it would be desirable to have a method to form non-metallized, highly electrically conductive vias such that the conductive material of the via is isolated from the bulk of the silicon wafer.

SUMMARY

The present invention relates to a method of forming an electrically conductive junction-isolated via in a silicon substrate. The method comprises providing a silicon substrate having first and second planar surfaces and growing an oxide layer on both surfaces. The method further comprises: forming through openings made in the oxide layer on both surfaces, areas to be used as electrical terminals and doping those areas; etching a hole through the substrate to a depth less than the substrate thickness to form a blind via; diffusing the via with a dopant different than the material of the silicon substrate such that the via is junction-isolated from the body of the substrate; opening an area in the oxide on the second surface opposite the via and diffusing the area to the via bottom with the same dopant as that diffused in the via; and depositing metal on the areas to be used as electrical terminals and photopatterning isolated terminals into each surface. In one embodiment, the via is formed using DRIE.

Under the circumstance that the via depth is such that the via bottom can not be reached by diffusion alone from the second surface, the method further comprises: doping the via etched through the substrate to make it resistant to a doping-selective etchant; forming through a hole opened in the oxide opposite the via on the second surface a pit to the depth of the bottom of the via using a doping-selective etch; and diffusing the pit with the same dopant as that diffused in the via to connect the inside doping of the via to the outside surface. Alternatively, when the substrate is p-type and the via is doped with an n-type material, the method further comprises: applying a voltage to the substrate to form an electrochemical etch-stop at the p-n junction of the via and the substrate; etching through a hole opened in the oxide opposite the via, a pit to the electrochemical etch-stop at the p-n junction; and diffusing the pit with an n-type material, connecting the inside doping to the outside surface.

The invention also relates to a method of forming an electrical apparatus electrically connected by multiple, junction-isolated, conductive interconnections. The method comprises: providing first and second silicon substrates having planar surfaces with the first substrate being a mating wafer and the second substrate being a via wafer; growing an oxide layer on both surfaces of the mating and via wafers; forming narrow ridges on the inner surface of both wafers to be used in thermocompression connection; forming openings in the oxide on the inner and outer surfaces of the via wafer for areas to be used as electrical terminals and doping those areas; etching a plurality of holes through the inner surface of the via wafer to a depth less than the thickness of the wafer to form blind vias; diffusing the vias with a dopant different than the material of the via wafer to isolate them from the body of the wafer; opening areas in the oxide on the outer surface of the via wafer opposite the vias and diffusing the areas to the via bottoms with the same dopant as that diffused in the vias; assembling the mating wafer and via wafer by thermocompression bonding; and depositing metal for electrical terminals on the surface of the assembled wafers and photopatterning isolated terminals into that surface.

In one embodiment, the method further comprises: forming narrow ridges of silicon on the inner surface of one wafer and narrow metal lines on the inner surface of the other wafer such that the silicon ridges and the metal lines intersect perpendicular to each other.

In the event that the via bottoms are not able to be contacted by diffusion alone from the outer surface of the via wafer, the method further comprises: doping the vias to make them resistant to a doping-selective etchant; forming through holes opened in the oxide opposite the vias, pits to the depth of the bottom of the vias in a doping-selective etch; and diffusing the pits with the same dopant as that diffused in the vias to connect the doping inside the vias to the outside surface. Alternatively, when the via wafer is p-type and the vias are doped with an n-type material, the method further comprises: applying a voltage to the via wafer to form an electrochemical etch-stop at the p-n junction of the vias and the via wafer; etching through holes opened in the oxide opposite the vias, pits to the electrochemical etch-stop at the p-n junction; and diffusing the pits with an n-type material, connecting the inside doping to the outside surface.

The present invention also relates to a conductive apparatus to carry electrical signal from one side of a silicon wafer to the other comprising: a silicon substrate having planar first and second surfaces covered with a thermally grown oxide layer; an electrically conductive blind via diffused with a dopant different than the material of the substrate; an area opposite the via on the second surface diffused to the via bottom with the same dopant as that diffused in the via; and metal terminals for electrical connection on both surfaces of the substrate. When the bottom of the via can not be contacted by diffusion alone from the second surface, the conductive apparatus further comprises a pit located opposite the via, beginning on the second surface and ending at the bottom of the via, diffused with the same dopant as that diffused in the via.

The invention further relates to an electrical apparatus that is electrically connected by interconnects in the second substrate comprising: first and second silicon substrates having planar inner and outer surfaces, the surfaces covered by a thermally grown oxide, the first substrate being a mating wafer having an active surface requiring electrical power, the second substrate being a conductive via wafer; a plurality of blind vias diffused with a dopant different than the material of the via wafer; areas opposite the vias on the second surface diffused to the via bottom with the same dopant as that diffused in the via; and metal terminals for electrical connection on both the inner and outer surfaces of the via wafer, the mating wafer and via wafer assembled by thermocompression bonding. In the event that the bottom of the vias can not be reached by diffusion alone from the outer surface of the via wafer, the invention further comprises pits located opposite the vias, beginning at the outer surface of the via wafer and ending at the bottom of the vias, diffused with the same dopant as that diffused in the vias. In one embodiment of the invention, the active surface of the mating wafer is a pressure sensor. In yet another embodiment of the invention, the active surface of the mating wafer is an accelerometer.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

A description of preferred embodiments of the invention follows. As used herein, "junction-isolated" refers to the isolation of an opening in a silicon substrate of one conductivity type by diffusing the opening with a dopant of another conductivity type, forming a junction at the intersection of the two different materials. The term "blind" as used herein is defined as an opening starting on one side of a silicon substrate that does not pass completely through the silicon substrate.

Figure 1A:
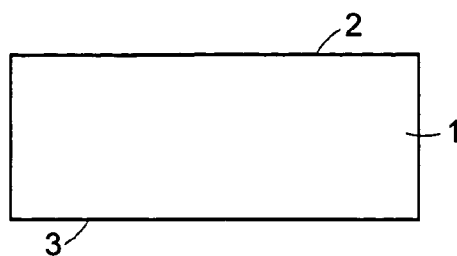
FIGS. 1A-1G are cross-sectional views illustrating-a sequential process for forming an electrically conductive, junction-isolated via in a silicon wafer.
Figure 1B:
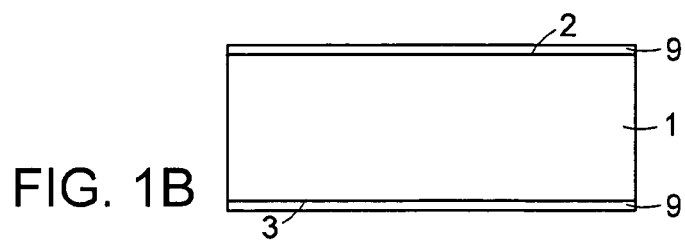
Figure 1C:
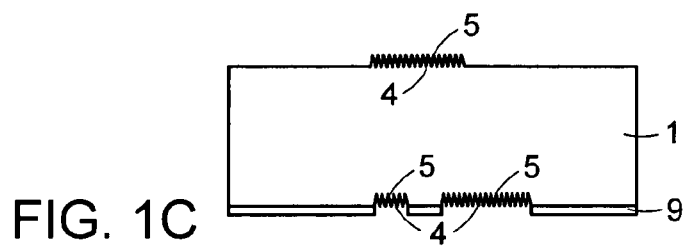
Figure 1D:
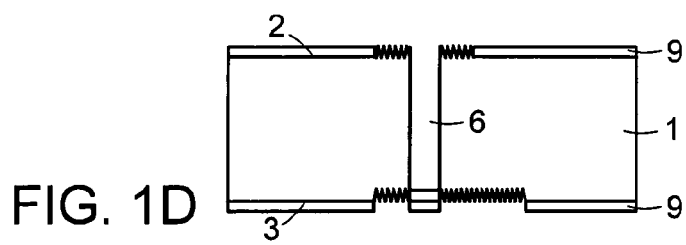
Figure 1E:
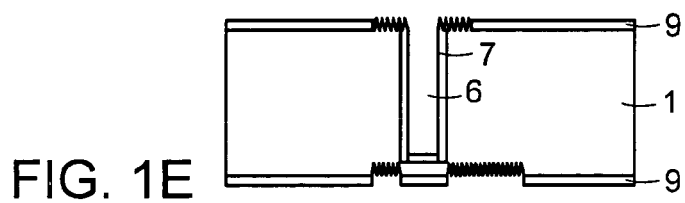
Figure 1F:
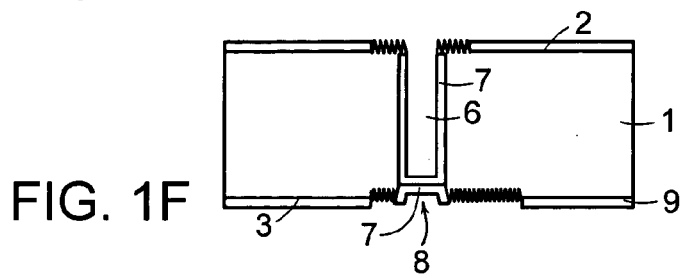
Figure 1G:
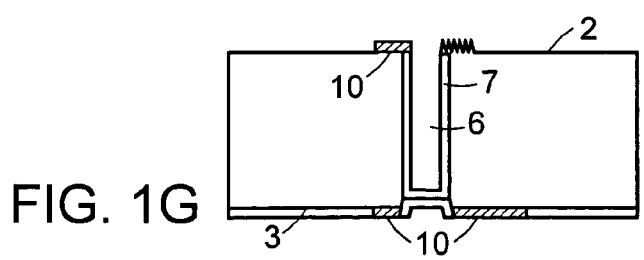

Referring to FIGS. 1A-1G, cross-sectional views of a sequential process for forming an electrically conductive via in a silicon wafer are shown. FIG. 1A shows a silicon substrate 1 having planar first surface 2 and second surface 3. In FIG. 1B, an oxide layer 9 is thermally grown on both first surface 2 and second surface 3. Openings are formed through oxide layer 9 on both surfaces for areas 4 to be used as electrical terminals in FIG. 1C, and areas 4 diffused with a dopant 5. In a preferred embodiment, areas 4 are doped with a dopant such as boron to a concentration of at least $4 \times 10^{19}$ boron per cubic centimeter. In FIG. 1D, a hole is etched through first surface 2 to a depth less than the thickness of substrate 1 to form a via 6 that ends blind. In a preferred embodiment, via 6 is formed using DRIE. In a further embodiment, via 6 is etched about 96 percent through substrate 1. In yet another embodiment, via 6 is formed such that it has vertical or nearly vertical walls. As shown in FIG. 1E, via 6 is diffused with dopant 7, junction-isolating via 6 from the body of substrate 1. In one embodiment, silicon substrate 1 is comprised of an n-type material and via 6 is diffused with a p-type material. In another embodiment, silicon substrate 1 is comprised of a p-type material and via 6 is diffused with an n-type material. In FIG. 1F, an area 8 is opened in the oxide opposite the bottom of via 6 and the area 8 diffused with the same dopant 7 as via 6, connecting the doped silicon to second surface 3. In FIG. 1G, metal is deposited on both surfaces of the substrate and isolated terminals 10 photopatterned into first surface 2 and second surface 3.

Figure 2A:
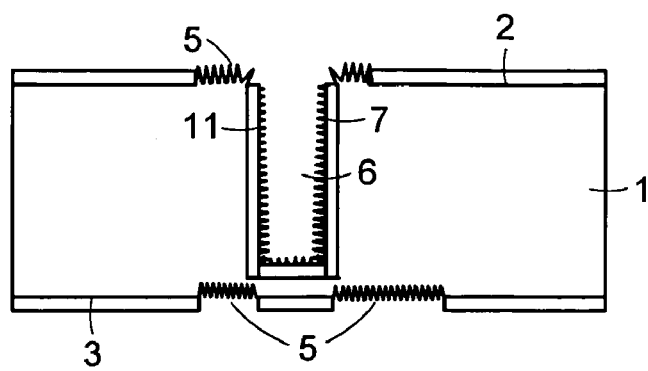
FIGS. 2A-2C are cross-sectional views illustrating a sequential process for connecting the blind via to the outside surface by forming a pit to a depth of the bottom of the via.
Figure 2B:
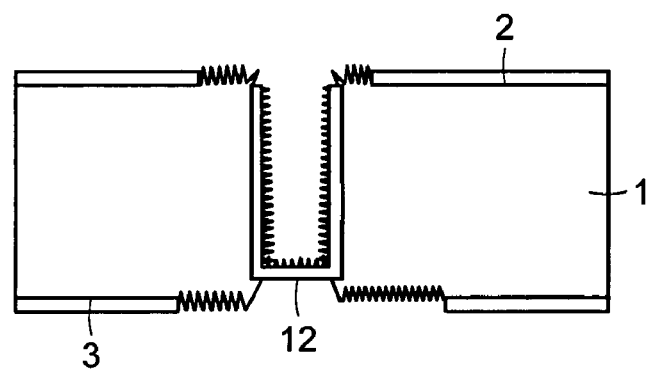
Figure 2C:
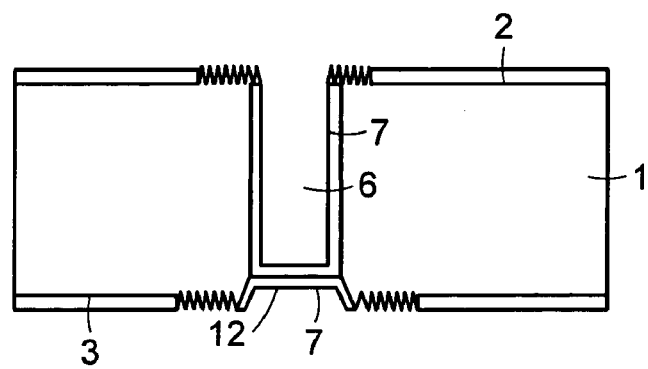

A further embodiment of the process to form an electrically conductive via in a silicon wafer is shown in FIGS. 2A-2C, which illustrate a process employed when the via bottom can not be contacted by diffusion alone as in FIG. 1F. In FIG. 2A, via 6 is diffused with dopant 11 to make via 6 resistant to a doping-selective etchant. In a preferred embodiment, via 6 is doped with a dopant such as boron to a concentration of at least $4 \times 10^{19}$ boron per cubic centimeter. As shown in FIG. 2B, a hole is opened through the oxide on second surface 3 to form pit 12 to the depth of the bottom of via 6 in a doping-selective etch. Like via 6, pit 12 is diffused with dopant 7 in FIG. 2C to form a continuous layer of doped silicon through via 6 to second surface 3. This connects inside doping 7 of via 6 to outside surface 3 for electrical conduction. In an alternative embodiment in which substrate 1 is p-type and dopant 7 diffused in the via is n-type, an electrochemical etch-stop is formed at the p-n junction of doped via 6 and substrate 1 by the application of voltage to substrate 1 in an electrochemical reactor. Then, as in FIG. 2B, a hole is opened through the oxide opposite via 6 on second surface 3 and pit 12 etched to the electrochemical etch-stop at the p-n junction. Pit 12 is then diffused with n-type dopant 7 as in FIG. 2C.

Figure 4:
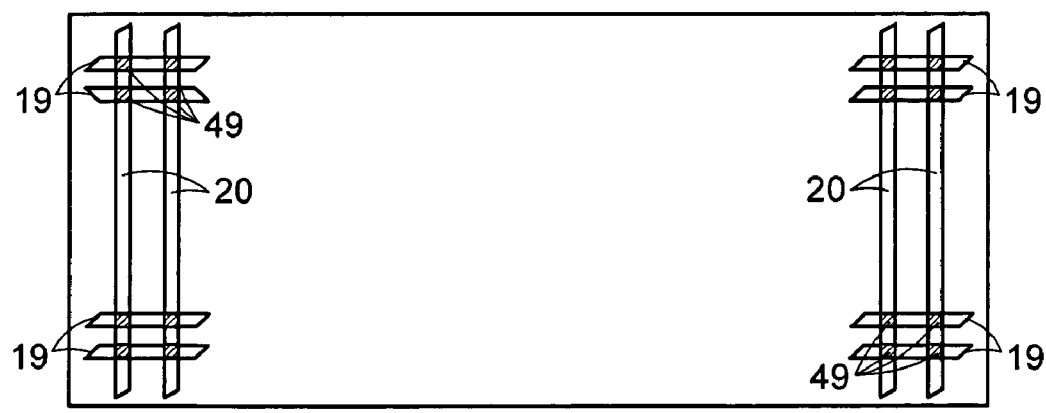
FIG. 4 is a cross-sectional view of the embodiment in FIG. 3H illustrating the inter-wafer connection of the narrow ridges by thermocompression bonding.
Figure 3A:
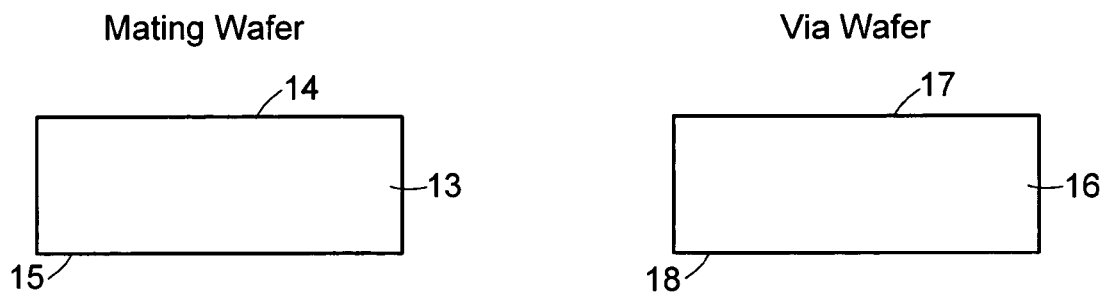
FIGS. 3A-3H are cross-sectional views illustrating a sequential process for forming an electrical apparatus with first and second silicon wafers electrically connected by multiple electrically conductive, junction-isolated vias.
Figure 3B:
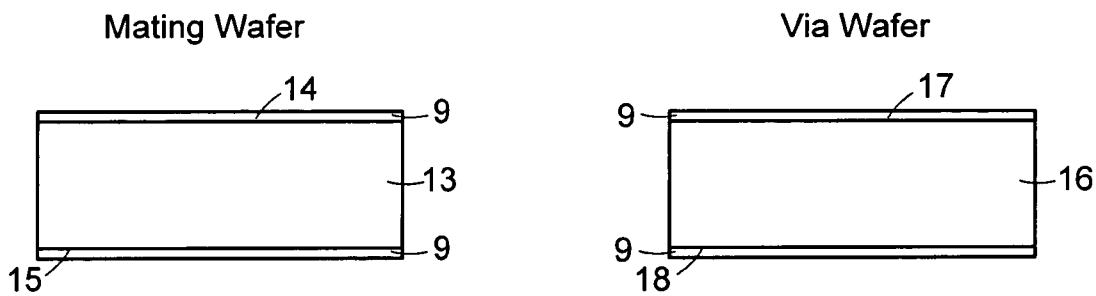
Figure 3C:
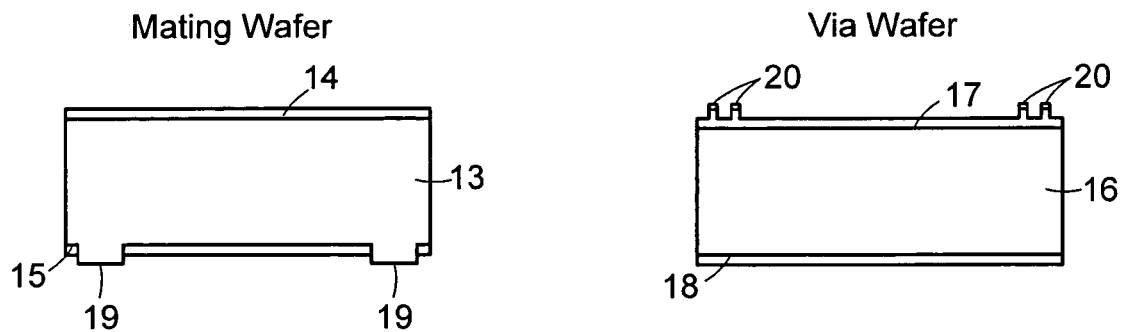
Figure 3D:
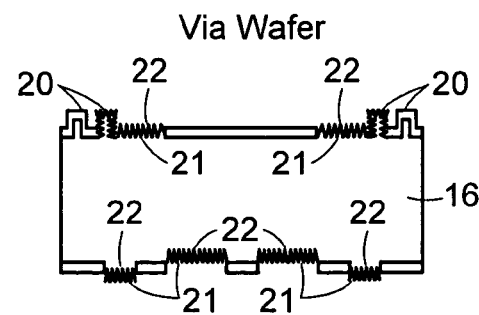
Figure 3E:
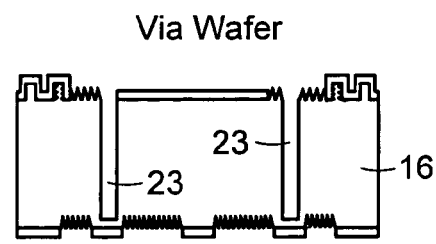
Figure 3F:
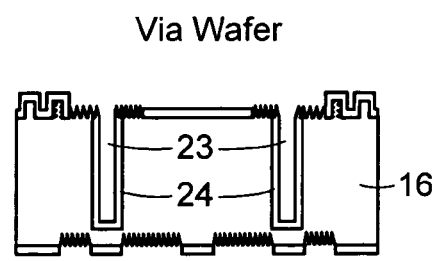
Figure 3G:
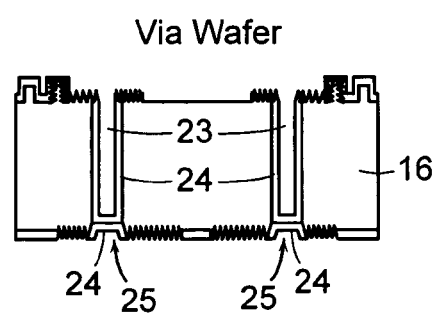
Figure 3H:
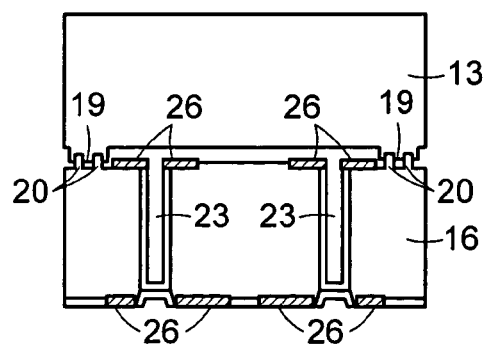

Referring to FIGS. 3A-3H, views in perspective are shown of a process to form an electrical apparatus with first and second wafers electrically connected by a multiplicity of junction-isolated, conductive interconnects. FIG. 3A shows a first silicon substrate 13 having planar first surface 14 and second surface 15, and a second silicon substrate 16 having planar first surface 17 and second surface 18. First silicon substrate 13 is a mating wafer while second silicon substrate 16 is a via wafer. In FIG. 3B, an oxide layer 9 is grown on both surfaces of mating wafer 13, surfaces 14 and 15, and on both surfaces of via wafer 16, surfaces 17 and 18. On inner surface 15 of mating wafer 13 and on inner surface 17 of via wafer 16, narrow ridges 19 and 20 respectively are formed in FIG. 3C to be used for thermocompression bonding of the two wafers. As shown in FIG. 3D, openings are made through oxide layer 13 on surfaces 17 and 18 of via wafer 16 to form areas 21 to be used as electrical terminals and those areas 21 are diffused with a dopant 22. In a preferred embodiment, areas 21 are doped with a dopant such as boron to a concentration of at least $4 \times 10^{19}$ boron per cubic centimeter. In FIG. 3E, a plurality of holes are etched through inner surface 17 of via wafer 16 to a depth less than the thickness of via wafer 16 to form vias 23 that end blind. In a preferred embodiment, vias 23 are formed using DRIE. In a further embodiment, vias 23 are etched about 96 percent through via wafer 16. In yet another embodiment, vias 23 are formed such that they have vertical or nearly vertical walls. In FIG. 3F, vias 23 are diffused with a dopant 24 different than the material of via wafer 16 such that the vias are junction-isolated from the body of via wafer 16. In one embodiment, via wafer 16 is comprised of an n-type material and vias 23 are diffused with a p-type material. In another embodiment, via wafer 16 is comprised of a p-type material and vias 23 are diffused with an n-type material. In FIG. 3G, areas 25 are opened in the oxide opposite the bottoms of vias 23 and the areas 25 diffused with the same dopant 24 as the via, connecting the conduction to outer surface 18. Mating wafer 13 and via wafer 16 are assembled in FIG. 3H by thermocompression bonding. In a further embodiment, narrow ridges of silicon are formed on the inner surface of one wafer and narrow metal lines are formed on the inner surface of the other layer so that the silicon ridges and metal lines align to intersect perpendicularly to each other for thermocompression connection at the areas of intersection 49 as shown in FIG. 4. In yet a further embodiment, ridges 20 on via wafer 16 are made of silicon and ridges 19 on mating wafer 13 are made of a metal suitable for thermocompression bonding. In FIG. 3G, metal is deposited on surface areas for electrical connection and electrical terminals 26 photopatterned into those surfaces.

The bonding of the two wafers can permit the hermetic separation of the two sides of the via wafer, with outer surface 18 exposed to atmospheric air while inner surface 17 and, consequently, vias 23 are at high vacuum. Hence, the process of forming an electrical apparatus with junction-isolated vias and creating a vacuum is particularly advantageous in forming a connector to an absolute pressure sensor, for example. In addition, the etching of the vias almost through the via wafer followed by a shallow diffusion on outer surface 18 of the via wafer leaves the outer surface nearly planar, enough so as to allow photopatterning operations on it. This ability to photopattern the outer surface of the via wafer would be beneficial for the application of gold to the apparatus after thermocompression bonding.

Figure 5A:
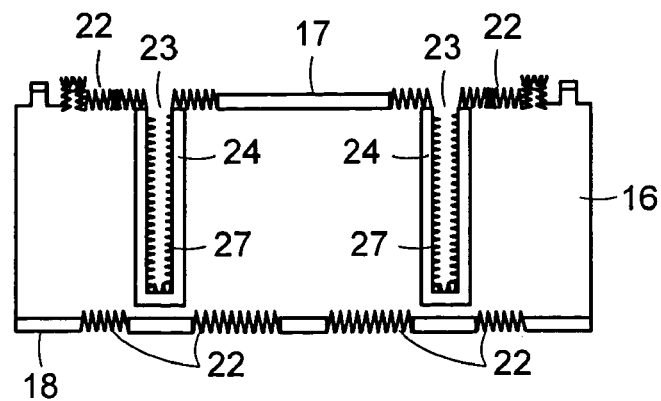
FIGS. 5A-5C are cross-sectional views illustrating a sequential process for connecting the blind vias in the electrical apparatus to the outside surface by forming pits to a depth of the bottom of the vias.
Figure 5B:
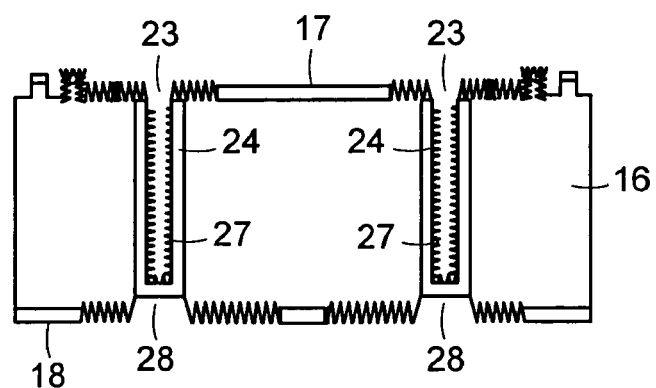
Figure 5C:
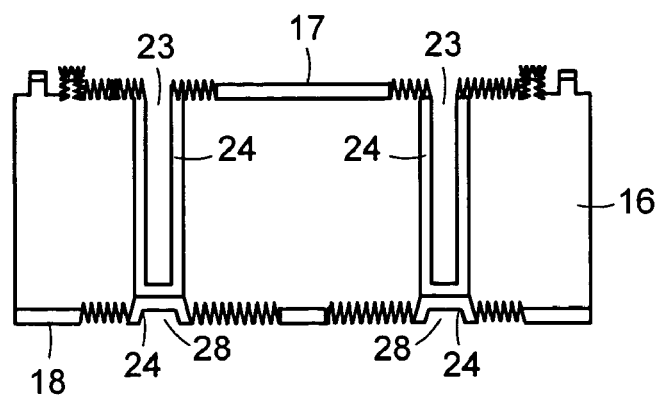

A further embodiment of a process to form an electrical apparatus with first and second wafers electrically connected by a multiplicity of junction-isolated, conductive interconnects is shown in FIGS. 5A-5C, which illustrates a process used when the via bottoms can not be contacted by diffusion alone as in FIG. 3G. On via wafer 16 in FIG. 5A, vias 23 are diffused with dopant 27 to make them resistant to a doping-selective etchant. In a preferred embodiment, vias 23 are doped with boron to a concentration of at least $4 \times 10^{19}$ boron per cubic centimeter. As shown in FIG. 5B, through holes opened in the oxide on surface 18 of via wafer 16, pits 27 are formed to a depth of the bottom of the vias in a doping-selective etch. In FIG. 5C, pits 28 are diffused with dopant 24 to form a continuous layer of doped silicon through vias 23 to outer surface 18 of via wafer 16. This connects inside doping 24 of vias 23 to outside surface 18 for electrical conduction. When via wafer 16 is p-type and vias 23 are doped with an n-type material, there is an alternative embodiment in which an electrochemical etch-stop is formed at the p-n junctions of doped vias 23 and via wafer 16 by the application of voltage to via wafer 16 in an electrochemical reactor. Then, as in FIG. 5B, holes are opened through the oxide opposite vias 23 on outer surface 18 and pits 27 etched to the electrochemical etch-stop at the p-n junctions. Pits 27 are then diffused with n-type dopant 24 as in FIG. 5C.

Figure 6A:
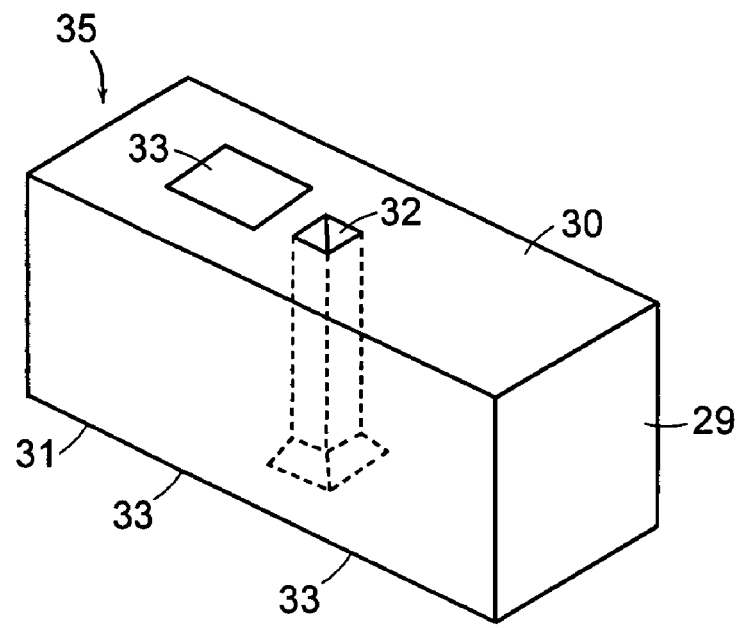
FIG. 6A is a view in perspective of a conductive apparatus that carries electrical signal from one side of a silicon wafer to the other side.

Referring to FIG. 6A, there is shown a conductive apparatus 35 illustrating an embodiment of the invention having a silicon substrate 29 with essentially planar, parallel first surface 30 and second surface 31, surfaces 30 and 31 covered with a thermally grown oxide layer. Through substrate 29 is conductive via 32 beginning at first surface 30 and ending blind at a depth less than the thickness of substrate 29, via 32 diffused with a dopant different than the material of substrate 29. In one embodiment, silicon substrate 29 is comprised of an n-type material and via 32 is diffused with a p-type material. In another embodiment, silicon substrate 29 is comprised of a p-type material and via 32 is diffused with an n-type material. In yet another embodiment, via 32 is etched about 96 percent through substrate 29. In a preferred embodiment, via 32 is formed using DRIE. In yet another embodiment, via 32 is formed with vertical walls. There are metal terminals 33 on surfaces 30 and 31 of conductive apparatus 35 for electrical connection.

Figure 6B:
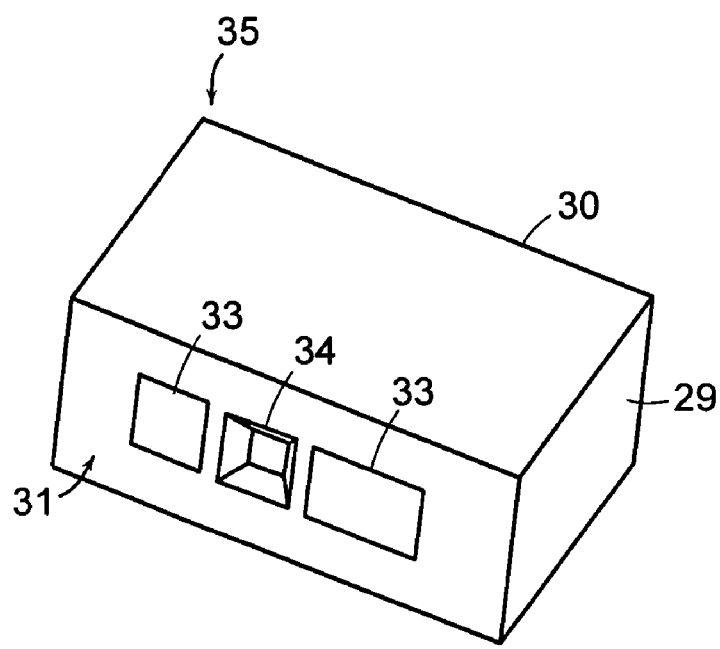
FIG. 6B is a view in perspective of the bottom surface of the embodiment in FIG. 6A.

In FIG. 6B, a view of conductive apparatus 35 along the perspective of second surface 31 is shown. In a preferred embodiment, conductive apparatus 35 further comprises pit 34 beginning at second surface 31 opposite via 32 and ending at the bottom of via 32, pit 34 diffused with the same dopant as that diffused in the via. Also shown in FIG. 6B are metal terminals 33 on second surface 31 for electrical connection.

Figure 7:
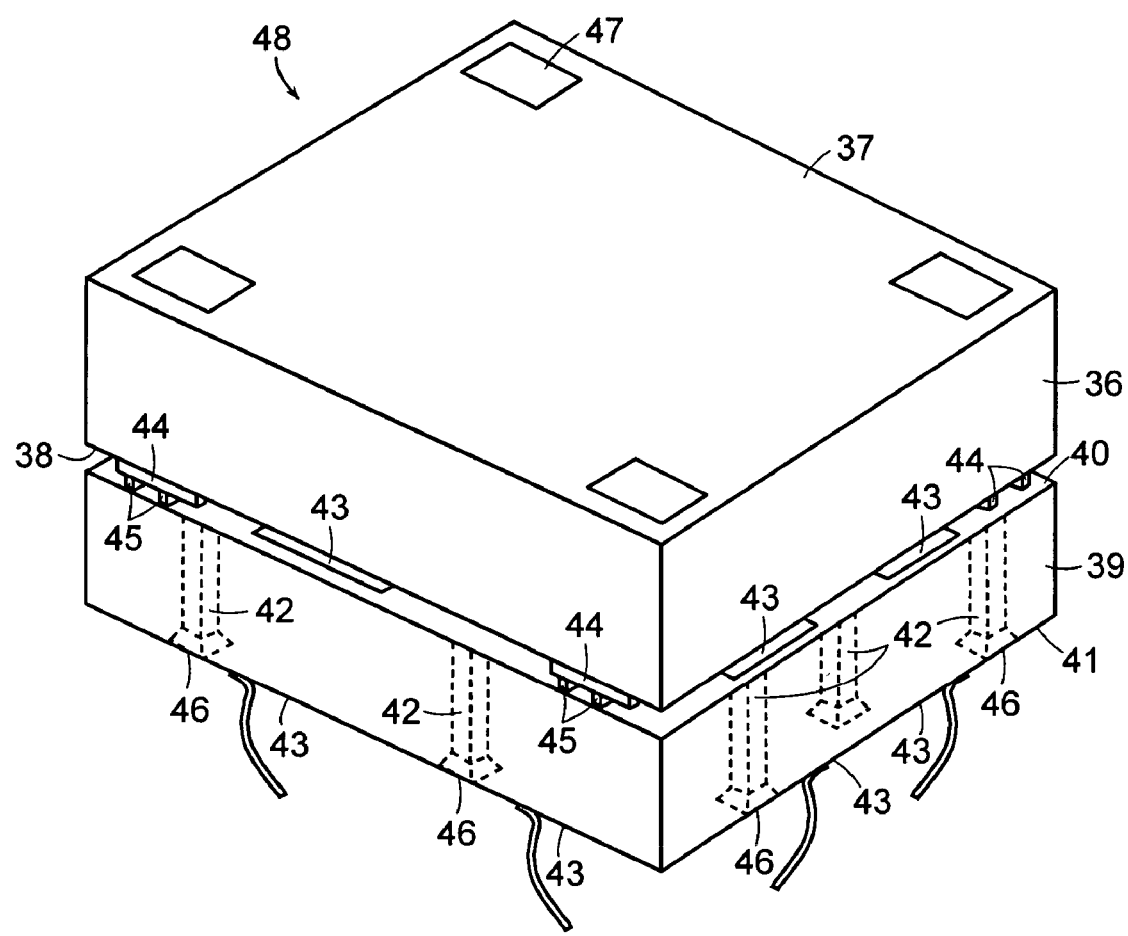
FIG. 7 is a view in perspective of an electrical apparatus comprising a first silicon wafer electrically connected by a second silicon wafer containing multiple electrically conductive vias.

Referring to FIG. 7, there is shown an electrical apparatus 48 having a first silicon substrate 36, a mating wafer, and a second silicon substrate 39, a conductive via wafer. Mating wafer 36 has parallel outer surface 37 and inner surface 38 while via wafer 39 has parallel inner surface 40 and outer surface 41, the surfaces of both wafers covered in a thermally grown oxide. Mating wafer 36 further comprises an active surface 37 comprised of a device that requires electrical power. Throughout via wafer 39 are a plurality of conductive vias 42 beginning at inner surface 40 and ending blind at a depth less than the thickness of via wafer 39, vias 42 diffused with a dopant different than the material of via wafer 39. In one embodiment, via wafer 39 is comprised of an n-type material and vias 42 are diffused with a p-type material. In another embodiment, via wafer 39 is comprised of a p-type material and vias 42 are diffused with an n-type material. In another embodiment, vias 42 are etched about 96 percent through via wafer 39. In a preferred embodiment, vias 42 are formed using DRIE. In yet another embodiment, vias 42 are formed with vertical walls. Metal terminals 43 for electrical connection are on both the inner surface 40 and outer surface 41 of via wafer 39.

In electrical apparatus 48, mating wafer 36 and via wafer 39 are assembled by thermocompression bonding narrow ridges 44 on mating wafer 36 and ridges 45 on via wafer 39. In a preferred embodiment, the ridges on one wafer are silicon and the ridges on the other wafer are metal. In a particularly preferred embodiment, ridges 44 and 45 are oriented perpendicularly to each other such that the areas of intersection are where thermocompression bonding occurs. In another embodiment, ridges 44 on mating wafer 36 are metal lines and ridges 45 on via wafer 39 are silicon.

In a further embodiment of electrical apparatus 48, pits 46 opposite vias 42 are formed beginning at outer surface 41 of via wafer 39 and ending at the bottom of vias 42, the pits diffused with the same dopant as that diffused in vias 42.

In another embodiment of electrical apparatus 48, the active surface 37 of mating wafer 36 is a pressure sensor having electrical terminals 47 on surface 37. In another embodiment of electrical apparatus 48, active surface 37 of mating wafer 36 is an accelerometer. In another aspect of the invention, active surface 37 of mating wafer 36 is an integrated circuit.

While this invention has been particularly shown and described with references to preferred embodiments thereof, it will be understood by those skilled in the art that various changes in form and details may be made therein without departing from the scope of the invention encompassed by the appended claims.

What is claimed is:

1. An electrical apparatus, comprising:
   a first silicon substrate having essentially inner and outer planar surfaces, the inner and outer planar surfaces covered with a thermally grown oxide layer the silicon substrate including:
   a conductive via opening beginning at the inner planar surface of the first silicon substrate and ending blind at a depth less than the thickness of the first silicon substrate, the conductive via opening diffused with a dopant different than material of the first silicon substrate,
   an area opposite the conductive via on the outer planar surface, diffused to bottom of the conductive via opening with the same dopant as that diffused in the conductive via,
   metal terminals for electrical connection on both inner and outer planar surfaces of the first silicon substrate; and
   a second silicon substrate with an inner planar surface coupled to the inner planar surface of the first silicon substrate and an outer active planar surface with electrical terminals.

2. The electrical apparatus of claim 1 wherein the first silicon substrate is comprised of an n-type material and the conductive via opening is diffused with a p-type material.

3. The electrical apparatus of claim 1 wherein the first silicon substrate is comprised of an p-type material and the conductive via opening is diffused with an n-type material.

4. The electrical apparatus of claim 1 wherein the conductive via is formed using DRIE.

5. electrical The apparatus of claim 1 wherein the conductive via opening is formed with vertical walls.

6. The electrical apparatus of claim 1 wherein the conductive via opening is etched about 96% through the first silicon substrate.

7. The electrical apparatus of claim 1 further comprising a pit opposite the conductive via opening beginning at the outer planar surface and ending at the bottom of the conductive via opening, said pit diffused with the same dopant as that diffused in the conductive via.

8. The electrical apparatus of claim 7 wherein the conductive via is doped with boron to a concentration of at least $4 \times 10^{19}$ boron per cubic centimeter.

9. The electrical apparatus of claim 7 wherein the first silicon substrate is p-type and the conductive via opening is n-type and an electrochemical etch-stop is formed at the p-n junction of the conductive via opening and the first silicon substrate.

10. The electrical apparatus of claim 1 further comprising narrow ridges of silicon on the inner planar surface of one silicon substrate and narrow metal lines on the inner planar surface of the other silicon substrate such that the narrow metal lines are the highest feature on the silicon substrate and they align to intersect perpendicular to the silicon ridges on the other silicon substrate.

11. The electrical apparatus of claim 10 wherein the silicon ridges are on the first silicon substrate and the narrow metal lines are on the second silicon substrate.

12. The electrical apparatus of claim 1 further comprising pits opposite the conductive vias openings beginning at the outer planar surface of a conductive via wafer and ending at the bottom of the conductive vias openings, said pits diffused with the same dopant as that diffused in the conductive vias openings.

13. The electrical apparatus of claim 12 wherein the conductive vias openings have been doped with boron to a concentration of at least $4 \times 10^{19}$ boron per cubic centimeter.

14. The electrical apparatus of claim 12 wherein the conductive via wafer is p-type and the vias are doped with an n-type material and an electrochemical etch-stop is formed at the p-n junctions of the conductive vias openings and conductive via wafer.

15. The electrical apparatus of claim 1 wherein the active planar surface of the second silicon substrate forms a portion of a pressure sensor.

16. The electrical apparatus of claim 1 wherein the active planar surface of the second silicon substrate forms a portion of an accelerometer.

17. The electrical apparatus of claim 1 wherein the active planar surface of the second silicon substrate forms a portion of an integrated circuit.

* * * * *